United States Patent [19]
Shou

[11] Patent Number: 5,861,063
[45] Date of Patent: Jan. 19, 1999

[54] PLASMA CVD DEVICE

[76] Inventor: Kentaro Shou, c/o Higashimatsuyama Factory of Zexel Corporation, 13-26, Yakyu-cho 3-chome, Higashimatsuyama-shi, Saitama-ken, Japan

[21] Appl. No.: 590,471

[22] Filed: Jan. 23, 1996

[30] Foreign Application Priority Data

Jan. 27, 1995 [JP] Japan .................................. 7-031748

[51] Int. Cl.$^6$ .............................. H05H 1/00; C23C 16/00
[52] U.S. Cl. ...................................................... 118/723 E
[58] Field of Search .......................... 118/723 E; 156/345

[56] References Cited

U.S. PATENT DOCUMENTS 5,534,070  7/1996  Okamura et al. ................... 118/723 E
5,542,559  8/1996  Kawakami et al. ................. 118/723 E

FOREIGN PATENT DOCUMENTS

64-13119   1/1989   Japan .
64-79375   3/1989   Japan .
5-311448  11/1993   Japan .

*Primary Examiner*—Thi Dang
*Attorney, Agent, or Firm*—Fish & Richardson P.C.

[57] ABSTRACT

A second electrode 20 having a container-like configuration defines a reaction space 29. A mounting portion 12 of a first electrode 10 and a workpiece W loaded on the mounting portion 12 are surrounded by the second electrode 20. A pair of auxiliary walls 27 project upwardly from a bottom wall 21 of the second electrode 20. The mounting portion 12 for the first electrode 10 is disposed in an arrangement area A defined by the auxiliary walls 27. The mounting portion 12 projects from upper end edges of the auxiliary walls 27.

6 Claims, 6 Drawing Sheets

PLASMA CVD DEVICE

BACKGROUND OF THE INVENTION

This invention relates to a plasma CVD device used for forming a film on a workpiece.

Recently, much attention is paid to plasma CVD, i.e., chemical vapor deposition utilizing plasma as a method for forming a film at a comparatively low temperature, for example, at a room temperature. In a typical device for carrying out such plasma CVD, as disclosed in FIG. 3 of Japanese Laid-Open Utility Model Application No. 13119/89, a first and a second planar electrodes are arranged in parallel relation within a vacuum vessel which is appropriately grounded. A high frequency power source is connected to the first electrode and the second electrode is grounded. The internal space of the vacuum vessel is provided as a reaction space. A part of reaction gas supplied into this reaction space is caused to be plasma by high frequency field generated between the first electrode and the second electrode. Negative ion or electron of all the plasma is violently motioned by this high frequency field. As a consequence, the reaction gas is partly decomposed to generate a radical. In the second electrode, a planar workpiece is mounted along the second electrode. The positive ion and radical are adhered to the surface of this workpiece, thereby to form a film.

In the above device, since the positive ion is not biased toward the workpiece, the film formed on the workpiece is low in adhesive strength and thin. Further, because of the reasons that a film is also formed on the first and second electrodes and plasma is also generated between the first electrode and the wall of a chamber faced with the first electrode, electric power is wastefully consumed.

A plasma CVD device, which is more resemble the present invention, is disclosed in Japanese Laid-Open Patent Application No. 311448/93. In this device, the internal space of the vacuum vessel is divided into plural sections by a wire net. The divided spaces are surrounded by the wall of the vacuum vessel and the wire net and provided as reaction spaces. The vacuum vessel and the wire net are appropriately grounded so that they serve as a second electrode. A first planar electrode is received in each of the reaction spaces. This first electrode is connected to a high frequency power source through an impedance matching circuit. A workpiece of a generally three-dimensional configuration is loaded on an upper surface of the first electrode. The positive ion of all the plasma generated by the high frequency field proceeds toward the workpiece due to bias function of the impedance matching circuit and the radical, accompanied by the positive ion, also proceeds to the same direction. As a consequence, a film is formed on the surface of the first electrode.

In the device disclosed by the above Japanese Laid-Open Patent Application No. 311448/93, the upper surface among all surfaces of the workpiece is faced with the second electrode. Since the positive ion and its accompanying radical collide with the upper surface generally at right angles, the film formed there is large in adhesive strength and thick. However, the film, which is formed on other surfaces of the workpiece perpendicular to the upper surface of the first electrode, especially the film formed on a lower end portion near the first electrode is small in adhesive strength and thin. The reasons are guessed that since the positive ion and its accompanying radical are drawn toward the upper surface of the first electrode, the amount of ion, etc. colliding the lower end portion of the workpiece is small and the ion, etc. are collided with the lower end portion of the workpiece diagonally instead of at right angles.

Further, a film is formed on the wide area of the upper surface of the first electrode, and the plasma generated between the lower surface of the first electrode and the second electrode faced with the lower surface does not contribute to the formation of film on the workpiece at all. Thus, electric power is wastefully consumed.

SUMMARY OF THE INVENTION

It is an object of the present invention to provide a plasma CVD device in which the thickness and adhesion strength of a film formed on a part in the vicinity of a first electrode in a workpiece can be brought closer to that of a film formed on a part away from the first electrode.

According to the present invention, there is provided a plasma CVD device comprising:

(a) a first electrode having a mounting portion for mounting a conductive workpiece thereon;

(b) a second electrode;

(c) vacuum drawing means for evacuating a reaction space between the first electrode and the second electrode;

(d) gas supply means for supplying a reaction gas into the reaction space;

(e) a high frequency power source connected to the first electrode and adapted to generate a plasma in the reaction space by supplying a high frequency power into the reaction space; and (f) bias means for biasing a positive ion of the plasma toward the workpiece;

wherein the second electrode has a container-like configuration surrounding the workpiece and the mounting portion of the first electrode and defining the reaction space so that a plasma generated within the reaction space can be confined therein; and the second electrode has an auxiliary wall projecting inwardly to define an arrangement area, and the mounting portion of the first electrode is arranged in the arrangement area in such a manner as to be electrically insulated from the auxiliary wall and allowed to project in a direction of projection of the auxiliary wall from a distal end of the auxiliary wall.

DETAILED DESCRIPTION OF THE EMBODIMENT

The present invention will now be described with reference to the drawing.

Figure 1:
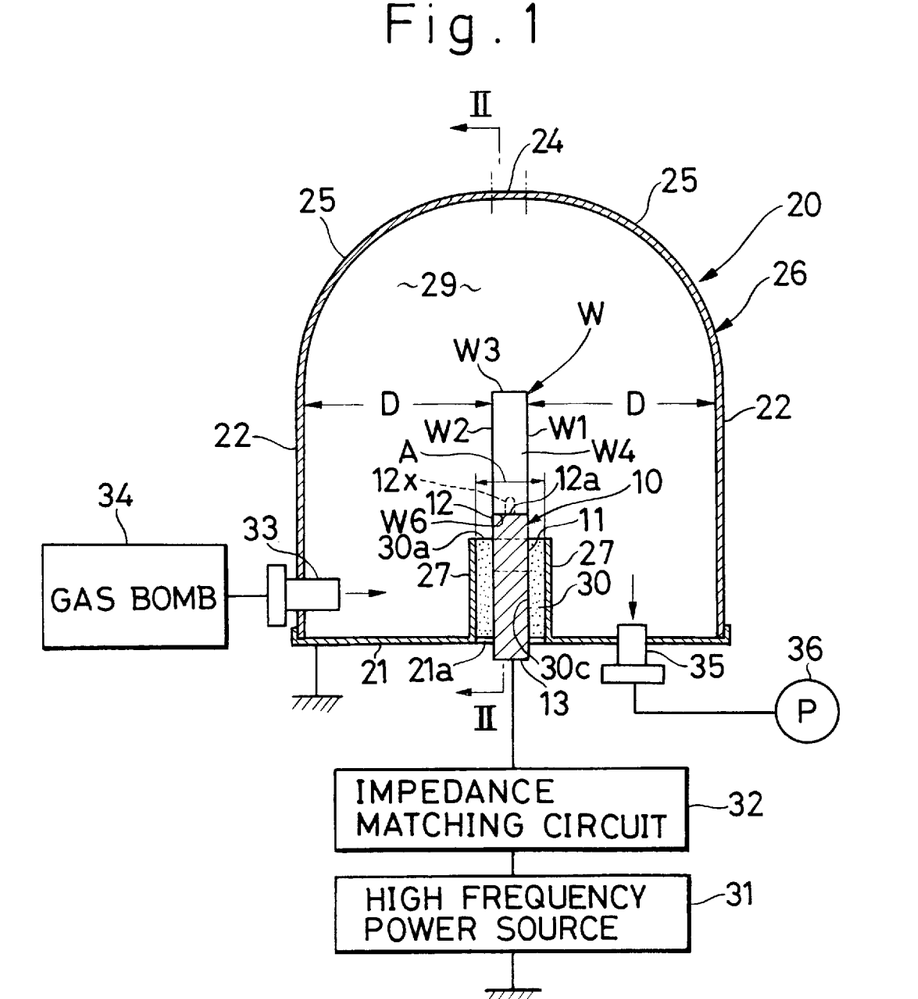
FIG. 1 is a sectional view showing a plasma CVD device for forming a film on a flat workpiece, according to one embodiment of the present invention.
Figure 2:
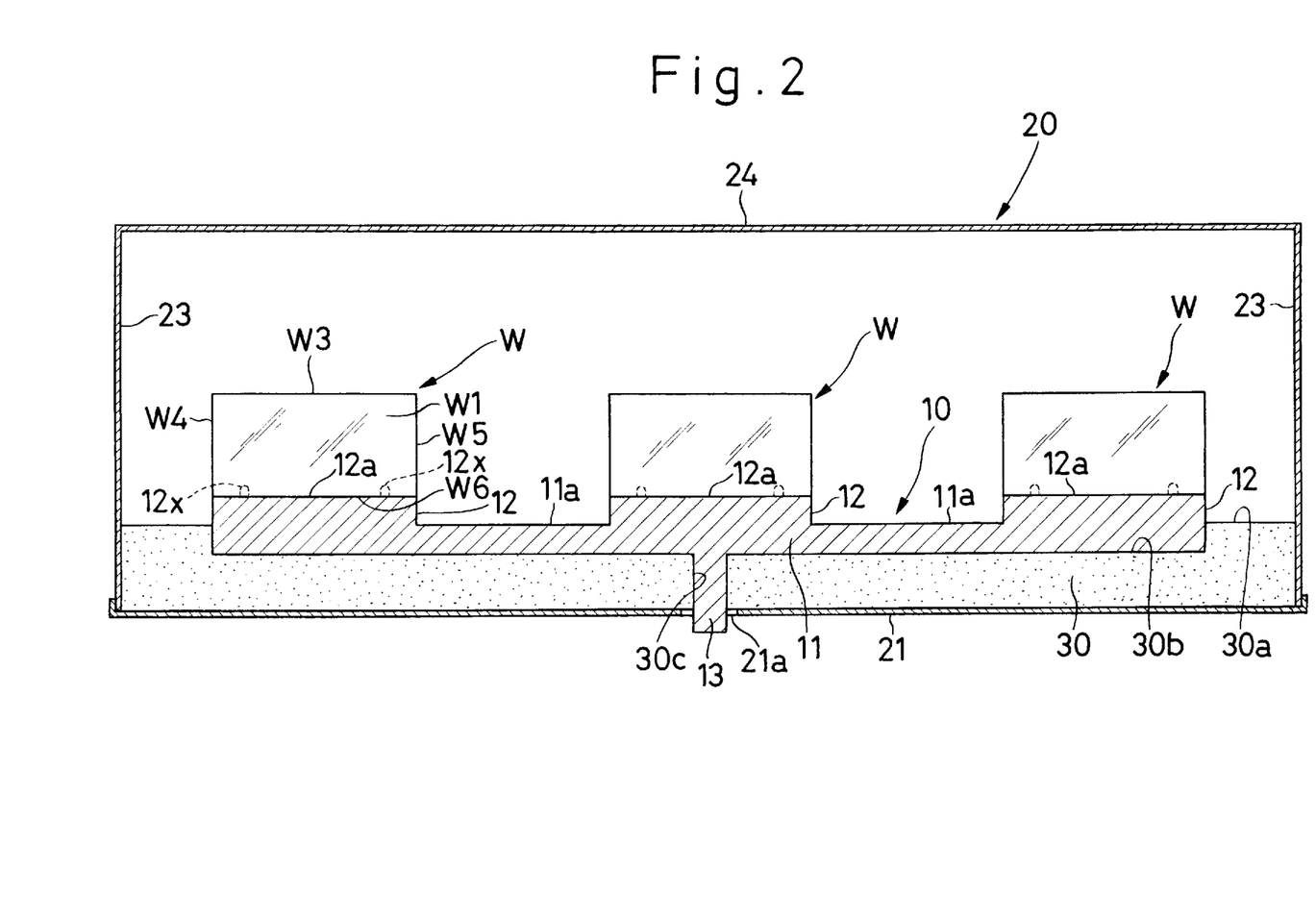
FIG. 2 is a sectional of the above device, taken on line II—II of FIG. 1.

In FIGS. 1 and 2, there is illustrated a plasma CVD device according to a first embodiment of the present invention. This plasma CVD device is intended for forming a film on a conductive workpiece W. This workpiece W is, for example, a vane of a vane pump. The workpiece W is formed of a rectangular flat plate (hexahedron). The workpiece W includes a pair of flat surfaces W1, W2 parallel to each other and having a wide area, a top surface W3, side surfaces W4, W5, and a bottom surface W6. The surfaces W1 through W5 are surfaces on which a film is to be formed. It is especially the surfaces W1, W2 and W3 which are required to have a high wear resisting property by means of application of a film. The bottom surface W6 is provided as a contact surface with respect to a first electrode 10 as later described. No film is, therefore, formed on this bottom surface W6.

The device includes the first electrode 10 and a second electrode 20. These electrodes 10, 20 are formed of a copper or stainless material. The electrodes 10, 20 are allowed to extend in a direction perpendicular to a sheet surface of FIG. 1.

The second electrode 20 is grounded to earth. The second electrode 20 has a container-like configuration in order to confine a plasma therein. An internal space of the second electrode 20 serves as a reaction chamber 29. The second electrode 20 includes a horizontal rectangular bottom wall 21 (first connecting wall), a pair of parallel side walls 22 (first opposing walls) vertically erected respectively from long sides of the bottom wall 21 as shown in FIG. 1, and a pair of parallel side walls 23 vertically erected from short sides of the bottom wall 21 as shown in FIG. 2, a rectangular horizontal top wall 24 (second opposing walls) having a narrow width, and an arcuate wall 25 (second connecting wall) for connecting the top wall 24 to the pair of side walls 22. The side walls 22, 23, the top wall 24 and the arcuate wall 25 altogether in unison constitute a hood portion 26. This hood portion 26 can be removably and air-tightly mounted on the bottom wall 21. A pair of auxiliary walls 27 are vertically erected from a widthwise central portion of the bottom wall 21 of the second electrode 20. These auxiliary walls 27 are parallel to the side walls 22 respectively and have a length same as the side walls 22. An arrangement area A for arranging the first electrode 10 therein is defined between a pair of spaced-away auxiliary walls 27. Distances between the pair of auxiliary walls 27 and the pair of side walls 22 facing with the auxiliary walls 27 respectively are equal.

As best shown in FIG. 2, the first electrode 10 includes an elongated base portion 11, a plurality (three, for example) of mounting portions 12 projecting upwardly from the base portion 11, and a protruded portion 13 protruding downwardly from the center of the base portion 11. The mounting portions 12 are equally spacedly arranged in the elongated direction of the base portion 11. An upper surface 12a (receiving surface) of each mounting portion 12 has the same configuration as the bottom surface W6 of the workpiece W. An upper surface 11a of portion of the base portion 11 situated between adjacent the mounting portions 12 is lower than the upper surfaces 12a of the mounting portions 12.

The first electrode 10 is disposed in the arrangement area A formed between the pair of auxiliary walls 27 of the second electrode 20. As shown in FIG. 1, opposite side surfaces of the first electrode 10 are situated away from the pair of auxiliary walls 27 with an equal interval. The first electrode 10 is shorter than the second electrode 20. Opposite end faces of the first electrode 10 are away from the pair of side walls 23 of the second electrode 20 with an equal interval.

Between the pair of auxiliary walls 27 of the second electrode 20, an insulative member 30 such as ceramic is received, thereby ensuring an electrical insulation between the electrodes 10, 20. The base portion 11 of the first electrode 10 is received in a receiving recess 30b formed in an upper surface 30a of the insulative member 30. In this embodiment, the upper surface 30a of the insulative member 30 and the upper surface 11a of the base portion 11 of the first electrode 10 are the same in height as the upper end edges of the auxiliary walls 27 of the second electrode 20. The mounting portions 12 of the first electrode 10 project upwardly from the upper end edges of the auxiliary walls 27.

The protruded portion 13 of the first electrode 10 extends downwardly from an opening 21a formed in the bottom wall 21 via a through-hole 30c formed in a central portion of the insulative member 30. A high frequency power source 31 is connected to this extended end of the protruded portion 13 through an impedance matching circuit 32.

The second electrode 20 is provided with a gas intake tube 33. A gas bomb 34 (gas supply means) containing a reaction gas is connected to this tube 33. The second electrode 20 is also provided with an exhaust tube 35. A vacuum pump 36 (vacuum drawing means) is connected to this tube 35.

The process for forming a film of an amorphous carbon on the workpiece W by a device thus constructed will now be described.

First, with the hood portion 26 of the second electrode 20 removed from the bottom wall 21, the workpieces W are mounted on the upper surfaces 12a of the three mounting portions 12 of the first electrode 10, respectively. In this embodiment, protruded portions 12x formed on the upper surfaces 12a and protruding upwardly are fitted into holes formed in the bottom surfaces W6 of the workpieces W, so that the workpieces W can positively be positioned and reliably be supported. It should be noted that a provision of those protruded portions 12x and holes is not essential.

With the workpieces W positively positioned, the bottom surfaces W6 of the workpieces W and the upper surfaces 12a of the mounting portions 12 are substantially coincident and as a result, the surfaces W1, W2, W4 and W5 are flush with corresponding side surfaces of the mounting portion 12.

After the workpieces W have been mounted, the hood 26 is attached to the bottom wall 21 air tight. In that state, the pair of side walls 22 of the second electrode 20 are faced with the flat surfaces W1, W2 of the workpieces W in parallel relation but spaced away by an equal distance D with respect to the flat surfaces W1, W2, respectively. The top wall 24 of the second electrode 20 is faced with the flat top surface W3 of each workpiece W, with the equal distance D away from the top surface W3. The arcuate wall 25 is arranged on a circle (a radius of this circle is equal to the distance D) having an intersection of the surfaces W1, W2 and W3 as its center.

The reaction space 29 surrounded by the second electrode 20 is evacuated by actuation of the vacuum pump 36. A reaction gas, for example, a mixed gas of tetramethylsilane (TMS) and methane gas, is supplied into the reaction space 29. Also, a high frequency electrical power is supplied to the first electrode 10 from the high frequency power source 31. At that time, since the workpiece W has a conductive property, it is functioned as a part of the first electrode 10.

A part of the gas within the reaction space 29 is caused to be a plasma by the high frequency electric power. First, a negative ion or electron is caused to reach chiefly the workpiece W and the second electrode 20 by a high frequency field. The electron, which has reached the second electrode 20, escapes to earth, while the electron, which has reached the workpiece W, is passed through the first electrode 10 and accumulated in a condenser of the impedance matching circuit 31. As a consequence, the workpiece W and the first electrode 10 are brought to be negative potential levels and draw positive ion as later described. The potential level of the workpiece W is brought to be a constant negative level and then stabilized.

Since the central (average) potential level is lower than a predetermined negative value in the area in the vicinity of the first electrode 10 and the workpiece W, no plasma is generated. Plasma is generated in that part of the reaction space 29 excluding the space in the vicinity of the first electrode 10 and the workpiece W. Also, chiefly due to violent motion of electron in the plasma, the gas is partly decomposed to generate a radical.

Figure 3:
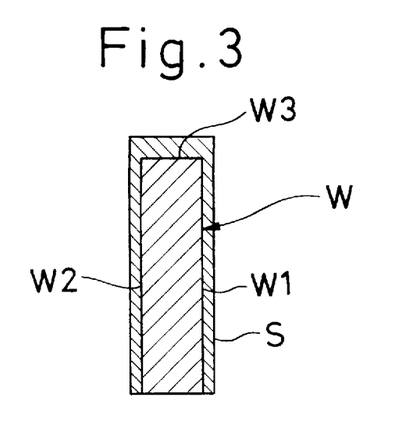
FIG. 3 is a vertical sectional view of the workpiece after the film has been formed thereon, the thickness of the film being illustrated in an exaggerated manner.

The positive ion of the plasma is caused to proceed toward the workpieces W due to gradient of the potential level generated in the area in the vicinity of the workpiece W and is finally collided against it. At that time, the radical also proceeds toward the workpieces W in accordance with the flow of the positive iron and is collided against it. Due to the collision of the positive ion and the radical, film S having a uniform thickness is formed on the surfaces W1 through W5 of the workpieces W with a large adhesive strength as shown in FIG. 3.

Formation of the film S will now be described in detail. The pair of side walls 22 and the top wall 24 of the second electrode 20 are faced with the pair of flat surfaces W1, W2 and the top surface W3 of the workpiece W, respectively. The area between each side wall 22 and the top wall 24 is covered with the arcuate wall 25. Owing to this arrangement, plasma is stably generated in a space surrounding the surfaces W1, W2 and W3 of the workpiece W. Moreover, since the potential gradient in the area in the vicinity of the workpiece W is generated in such a manner as to draw a potential line generally parallel with the surfaces W1, W2 and W3 of the workpiece W, the positive ion can be caused to collide against the surfaces W1, W2 and W3 from a substantially perpendicular direction thereto and with a large collision energy. As a consequence, the film S formed on the surfaces W1, W2 and W3 is thick and has a large adhesive strength.

Since the distance D from the flat surface W1 to the corresponding side wall 22 is equal to the distance D from the flat surface W2 to the corresponding side wall 22, the thickness of the film S formed on the flat surfaces W1, W2 can be made equal to each other.

Formation of the film S on the lower end portions of the flat surfaces W1, W2 is as follows. The mounting portion 12 of the first electrode 10 is arranged in the narrow arrangement area A defined by the auxiliary walls 27. Moreover, since this mounting portion 12 is flush with the flat surfaces W1, W2 of the workpiece W, the same potential gradient as the upper portion can be obtained at the lower end portions of the flat surfaces W1, W2. Furthermore, since the mounting portion 12 is protruded upwardly from the auxiliary walls 27, the potential gradient of the lower end portions of the flat surfaces W1, W2 is not affected by the auxiliary walls 27. As a consequence, the film S formed on the lower end portions of the flat surfaces W1, W2 can obtain an adhesive strength and thickness of no difference with respect to the area thereabove.

Formation of the film S on the side surfaces W4, W5 is as follows. The side surfaces W4, W5 of each workpiece W are faced with the side wall 23 or separated away from other workpieces W with a sufficient interval. Further, the upper surface 11a of the base portion 11 between the mounting portions 12 is depressed, whereas the side surfaces W4, W5 of the workpiece W are flush with the side surface of the mounting portion 12. Owing to this arrangement, a comparatively favorable film S can be formed on the side surfaces W4, W5.

Next, the necessity of a provision of the auxiliary walls 27 will be described in detail. In order to provide a favorable film formation on the lower end portion of each workpiece W, it can be contemplated that the first electrode 10 is allowed to project from the bottom wall 21 of the second electrode 20 for exposure, without forming the auxiliary walls 27. In this case, in order that no adverse effect is applied to the potential gradient of a nearby workpiece W due to the horizontally spreading bottom wall 21, it is necessary to allow the first electrode 10 to project greatly upwardly from the bottom wall 21 of the second electrode 20, thereby greatly separating the workpiece W from the bottom wall 21. With a device thus constructed, however, a film is formed on the large surface of the first electrode 10 which is allowed to extend from the bottom wall 21 for exposure, and waste of electric power consumption is resulted.

In this embodiment, a large part of the first electrode 10 is covered with the auxiliary walls 27. Since the auxiliary walls 27 are not horizontally spread in the sense of a plane, a protruded amount (a protruded amount of the mounting portion 12 of the first electrode 10 from the upper end edge of each auxiliary wall 27) can be reduced. The protruded amount refers to the amount for enabling the electric gradient in the area in the vicinity of the lower end portion of the workpiece W to be free from an adverse effect from the auxiliary walls 27. Accordingly, the area of the first electrode 10 exposed to the reaction space 29 can be minimized, and power consumption can be minimized.

Since the second electrode 20 having a container-like configuration defines the reaction space 29 in order to confine a plasma therein, the generated plasma can effectively be utilized. Power consumption can also be saved by this. Further, since a film can simultaneously be formed on the three workpieces W, productivity is high.

It should be noted that since the second electrode 20 coacts with the first electrode 10 and the insulative member 30 to provide a vacuum vessel in this embodiment, it is no more required to provide a vacuum vessel surrounding the second electrode 20. Thus, the device can be made small in size.

Using the device of FIGS. 1 and 2, a test for forming a film was made. In this test, an aluminum alloy of a hexahedron of 40 mm×20 mm×5 mm was used as the workpiece W. The dimension of the device was as follows. The height of the auxiliary wall 27 was 20 mm, the distance between the auxiliary wall 27 and the first electrode 10 was 3 mm, and the protruded amount of the mounting portion 12 from the upper end edge of the auxiliary wall 27 was 5 mm. The receiving surface of the mounting portion 12 has a rectangular configuration of 20 mm×5 mm. With the three workpieces W mounted on the first electrode 10, the arrangement interval between adjacent workpieces W was 40 mm. In FIG. 2, the distance between the side surface W4 of the left workpiece W to the side wall 23 and the distance between the side surface W5 of the right workpiece W and the side wall 23 of the other side wall 23 were 20 mm. The distances between the flat surfaces W1, W2 of the workpieces W and the corresponding side walls 22 were 35 mm, and the distance between the top surface W3 of the workpiece W and the top wall 24 was also 35 mm.

Other conditions were as follows.

| Material gas | $CH_4$ + TMS (tetramethylsilane) |
| --- | --- |
| Gas pressure | 8 Pa |
| Input power | 150 W (13.56 MHz) |
| Gas flow rate | $CH_4$: 5 sccm TMS: 0.7 scm (note: sccm is a short of standard cubic centimeter/min.) |
| Film growth time | two hours |

As a result of the above test, the thickness of the amorphous carbonic film S formed on the top surface W3 of the workpiece W was 10 $\mu$m and was generally uniform over the entire area of the top surface W3. The thickness of the film S formed on the side surfaces W4, W5 was all 7 $\mu$m (±0.5 $\mu$m) and the thickness of the film S on each surface was uniform. The adhesive strength of the film S on the surfaces W1 through W5 was measured as a peel-off load by scratch test. The result obtained was 30N. It should be noted that the adhesive strength can be represented by the peel-off load.

Next, a comparison test will be described. The first and second electrodes were formed of a disk having a diameter of 180 mm, parallel with each other and vertically away from each other with an interval of 65 mm. These electrodes were received in the vacuum vessel. A single workpiece W was loaded on the center of the upper surface of the lower first electrode. The dimension of the workpiece W and other conditions were the same as the result of test carried out by the device of this embodiment. In this comparison test, the thickness of the film S on the top surface 3 of the workpiece W was 6 $\mu$m and uniform over the entire area. The thickness of the film on the surfaces W1, W2, W4 and W5 was decreased toward a lower end and 4 $\mu$m maximum and 1 $\mu$m minimum. The peel-off load was 30N on the top surface W3, and about 10N on other surfaces W1, W2, W4 and w5.

As apparent from the comparison of the above two test results, according to the present invention, the thickness of the film and adhesive strength were found to be improved extensively.

Only a single workpiece W may be disposed within the container-like second electrode 20. In that case, both the first and second electrodes 10 and 20 are formed short, and the opposing side walls 23 of the second electrode 20 are faced with the two side surfaces W4 and W5 of the workpiece W2, respectively. The auxiliary wall may have a sleeve-like configuration which is rectangular in section and which surrounds the mounting portion of the first electrode.

Figure 4A:
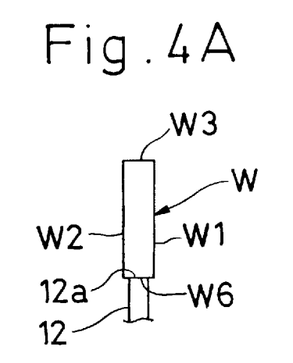
FIG. 4A is a side view showing the configurations of a workpiece and a mounting portion according to a modification of the present invention.
Figure 4B:
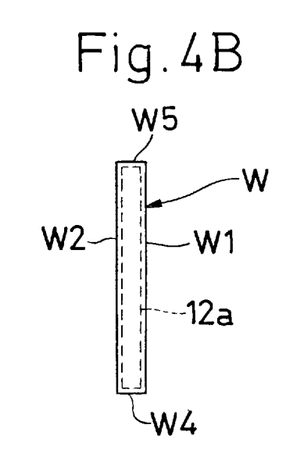
FIG. 4B is a plan view of FIG. 4.

As shown in FIGS. 4A and 4B, the upper surface 12a of the mounting portion 12 may be smaller than the bottom surface W6 of the workpiece W. In that case, a peripheral edge portion of the bottom surface W6 projects horizontally from the mounting portion 12 to form a step. This step does not affect the potential gradient of the lower end portion of the workpiece W.

Figure 5A:
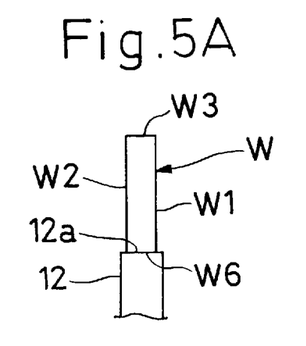
FIG. 5A is a side view showing the configurations of a workpiece and a mounting portion according to another modification of the present invention.
Figure 5B:
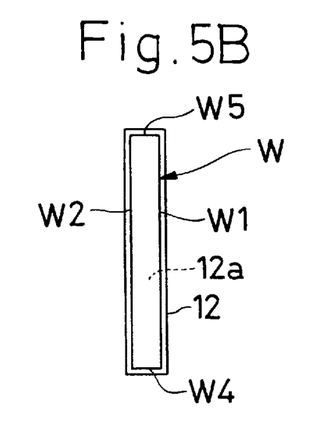
FIG. 5B is a plan view of FIG. 5A.

As shown in FIGS. 5A and 5B, the upper surface 12a of the mounting portion 12 may be smaller than the bottom surface W6 of the workpiece W. In that case, a peripheral edge portion of the upper surface 12a projects horizontally from the workpiece W to define a step. If this step is within a range of the predetermined projection amount, this step does not affect the potential gradient of the lower end portion of the workpiece W.

Figure 6:
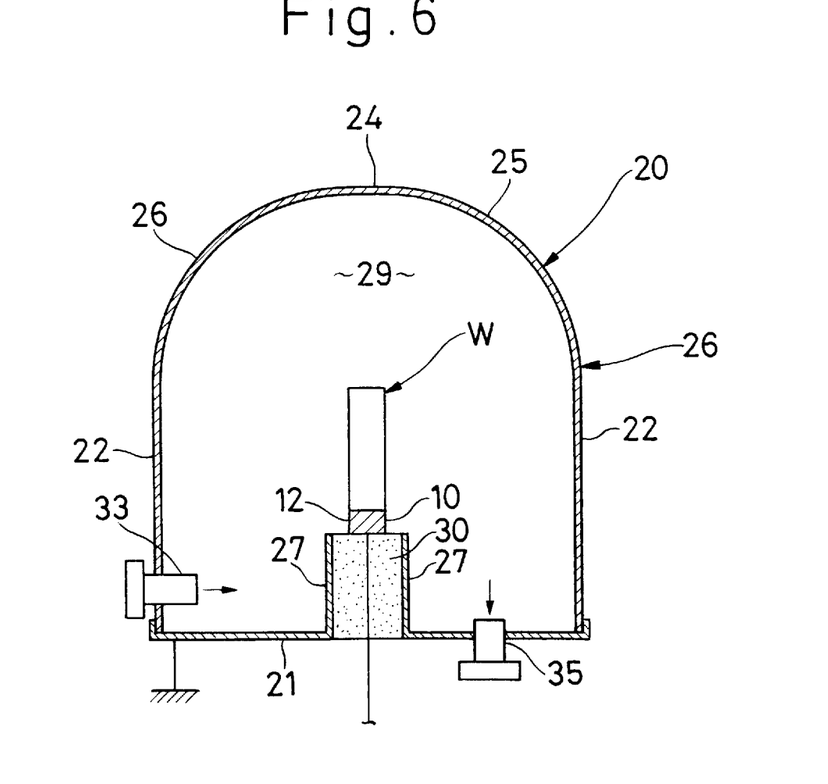
FIG. 6 is a sectional view corresponding to FIG. 1, but according to another embodiment of the present invention.

In the device shown in FIG. 6, the insulative member 30 is received between the auxiliary walls 27. The upper surface of the insulative member 30 and the upper end edge of the auxiliary wall 27 are the same in height. A plurality of the first electrodes 10 are firmly secured to the upper surface of the insulative member 30 in such a manner as to project from the auxiliary wall 27. These first electrodes 10 are provided directly as the mounting portions 12. Also in this device, similar operational effects as those of the embodiments shown in FIGS. 1 and 2 can be obtained.

It is also acceptable that the second electrode is formed into a container-like configuration using a wire-net so as to confine only the plasma therein. In that case, the second electrode is received in the vacuum vessel. The gas bomb and the vacuum pump are connected to this vacuum vessel.

The protruding direction of the auxiliary wall and of the mounting portion of the first electrode may be horizontal. In that case, unique mounting means are required for mounting a workpiece to the mounting portion.

Figure 7:
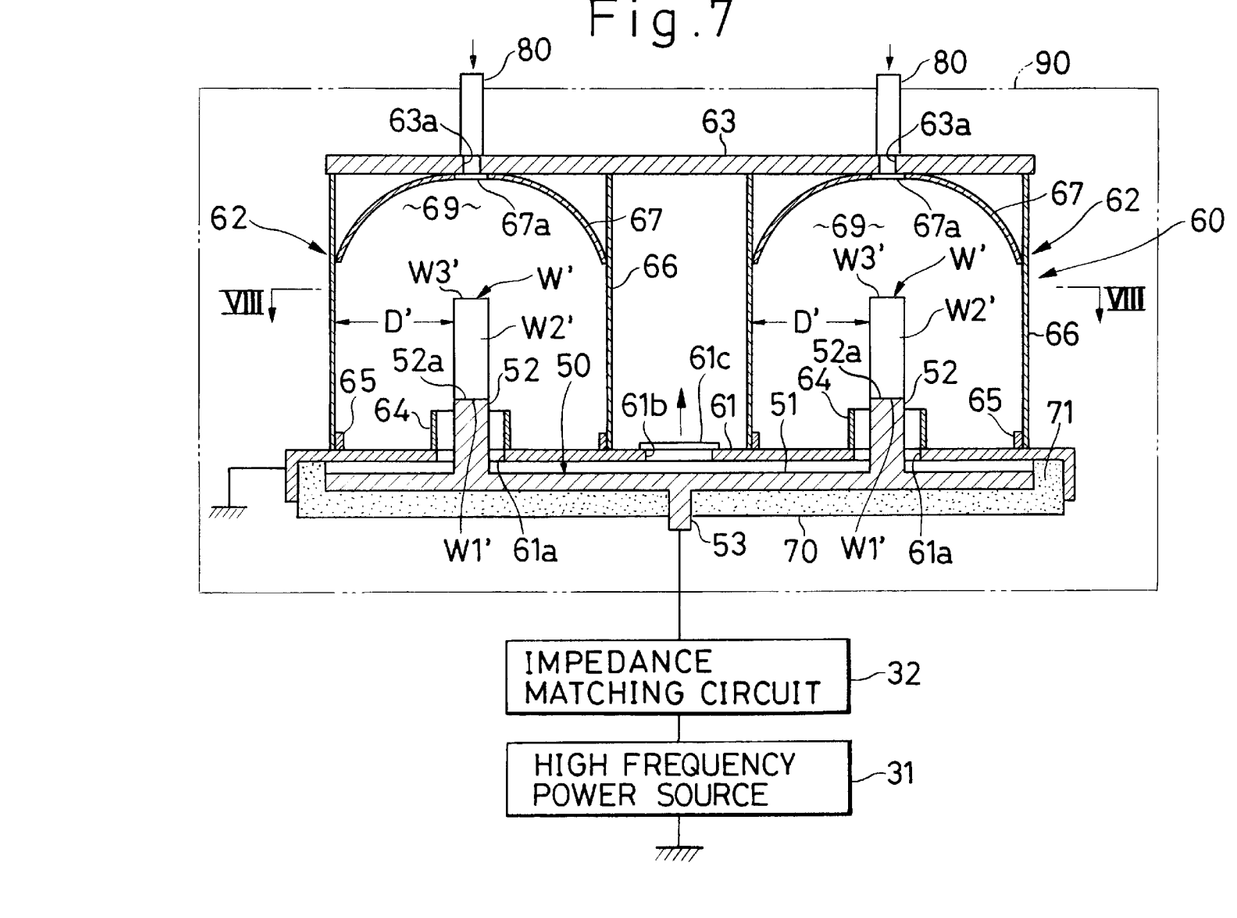
FIG. 7 is a vertical sectional view showing a plasma CVD device for forming a film on a column-like workpiece.
Figure 8:
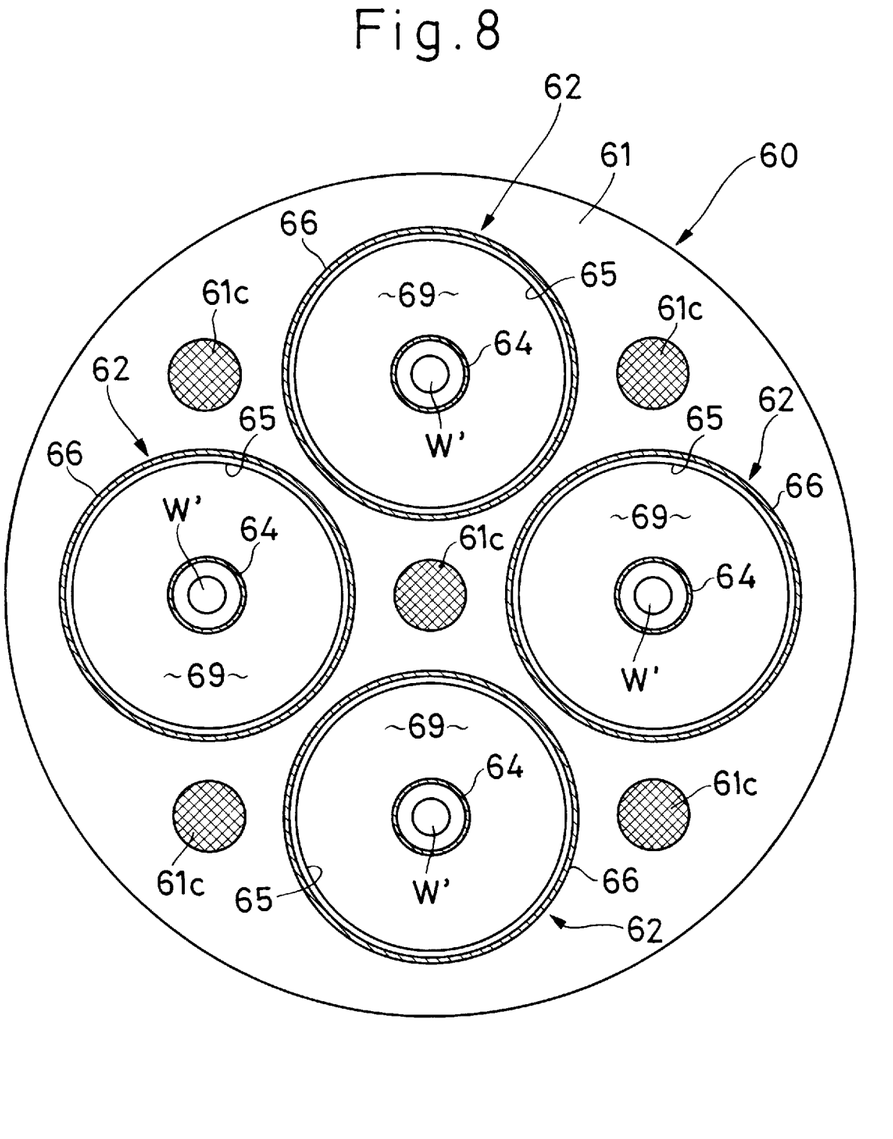
FIG. 8 is a sectional view taken on line VIII—VIII of FIG. 7.

The device shown in FIGS. 7 and 8 is used for forming a film on a column-like workpiece W' such as a drill and a pin. One end face W1' of a workpiece W' serves as a contact surface to be contacted with a first electrode 50 as later described. Similarly, a peripheral surface W2' and the other end face W3' serve as surfaces on which a film is to be formed.

The above device includes the first electrode 50 and a second electrode 60 made of copper or stainless. The second electrode 60 includes a disk-like horizontal base portion 61 (first connecting wall), a plurality (four, for example) of hood portions 62 removably mounted on an upper surface of the base portion 61, a disk-like horizontal connecting plate 63 for connecting upper ends of the hood portions 62, and cylindrical auxiliary walls 64 firmly secured to the upper surface of the base portion 61 within the hood portions 62.

A plurality (four, for example) of insertion holes 61a are formed in the base portion 61 with equal intervals away in a circumferential direction. A plural (five, for example) gas outlet ports 61b are formed in location away from the insertion holes 61a. The gas outlet ports 61b are attached with nets 61c, respectively. The auxiliary wall 64 is firmly secured to a peripheral edge of the insertion holes 61a in such a manner as to concentrically surround the insertion holes 61a. A cylindrical mounting sleeve 65 is firmly secured to the upper surface of the base portion 61 in such a manner as to be concentric with the insertion holes 61a and the auxiliary wall 64.

Each hood portion 62 coacts with the base portion 61 to define a reaction space 69. Each hood portion 62 includes a cylindrical sleeve 66 (first opposing wall) and a semi-spherical shell-like cup 67 (second connecting wall) firmly secured to an intermediate inner periphery of the cylindrical sleeve 66. A top portion 67a (second opposing wall) of the cup 67 is flat and formed of a net. The hood portions 62 are mounted on the base portion 61 with lower end portions of the hood portions 62 fitted into the mounting sleeve 65. In that state, the cylindrical sleeve 66 is arranged concentrical with the insertion holes 61a and the auxiliary wall 64.

An upper end of the cylindrical sleeve 66 of the hood portions 62 and the top portion 67a of the cup 67 are attached to a lower surface of the connecting plate 63. A gas intake hole 63a is formed in the connecting plate 63 in such a manner as to correspond to the top portion 67a of the cup 67. A gas bomb (not shown) is connected to the gas intake hole 63a through an upwardly extending tube 80.

The first electrode 50 includes a base portion 51 horizontally arranged, and a column-like mounting portion 52 vertically projecting from the upper surface of the base portion 51. The base portion 51 of the first electrode 50 is placed on a parallel disk-like insulative member 70. An upwardly projecting ring-like projection 71 is formed on a peripheral edge portion of the insulative member 70. The base portion 61 of the second electrode 60 is placed on an upper surface of the projection 71. As a consequence, the base portion 51 of the first electrode 50 is spaced away with a small interval from under the base portion 61 of the second electrode 60.

A protruded portion 53 is formed on the center of a lower surface of the base portion 51 of the first electrode 50. This protruded portion 53 extends downwardly through the insulative member 70. A high frequency power source 31 is connected to this extended end of the protruded portion 53 through an impedance matching circuit 32.

The first electrode 50, the second electrode 60 and the insulative member 70 are received in the vacuum vessel 90. A vacuum pump (not shown) is connected to this vacuum vessel 90.

The process for forming a film of an amorphous carbon on the workpiece W' by the device thus constructed will be described.

First, with the hood portions 62 of the second electrode 60 removed from the base portion 61, the workpiece W' are loaded for positioning on upper surfaces 52a (receiving surfaces) of all mounting portions 52 of the first electrode 50. With the workpieces W' thus positioned, bottom surfaces W1' of the workpieces W' are substantially coincident with the upper surface 12a of the mounting portion 12. As a consequence, peripheral surfaces W2' of the workpieces W' are flush with a peripheral surface of the mounting portion 52.

After the workpieces W' have been mounted, the hood portions 62 are mounted on the base portion 61. In that state, the cylindrical sleeve 66 of the second electrode 60 is faced with the peripheral surfaces W2' of the workpieces W' in parallel relation but spaced away by an equal distance D' over the entire periphery of the workpieces W'. Similarly, the top portion 67a of each cup 67 is faced with the top surfaces W3' of the workpieces W' but spaced away by the same distance D' therefrom.

After the hood portions 62 have been mounted, the vacuum vessel 90 is closed, the vacuum pump is actuated and then, a reaction gas is supplied from the gas bomb. This reaction gas enters the reaction space 69 from the gas intake port 63a of the connecting plate 63 via the top portion 67a of each cup 67. Then, it passes between the auxiliary wall 64 and the mounting portion 52, then through the insertion holes 61a of the base portion 61, then between the base portions 51 and 61, and is finally discharged into the vacuum vessel 90 through the gas discharge hole 61b. In that state, a high frequency power is supplied to the first electrode 50 from the high frequency power source 32.

With respect to the plasma generation, radical generation, and bias of positive ion to the workpiece, they are substantially the same as the first embodiment and therefore, description thereof is omitted.

The positive ion and radical proceed toward the workpiece W' due to gradient of a potential level generated in the area in the vicinity of the workpiece W' and then collides with the peripheral surface W2' and the top surface W3' of the workpiece W'. Due to this collision of the positive ion and radical, a film of a uniform thickness is formed on the surfaces W2' and W3' of the workpiece W' with a large adhesive strength.

Formation of the film will now be described in detail. The cylindrical sleeve 66 of the second electrode 60 and the top portion 67a of the cup 67 are faced respectively with the peripheral surface W2' and the top surface W3' of the workpiece W'. The area between the cylindrical sleeve 66 and the top portion 67a is covered with the cup 67. Because of this reason, plasma is generated stably in a space surrounding the surfaces W2', W3' of the workpiece W'. Furthermore, since the potential gradient in the area in the vicinity of the workpiece W' is generated in such a manner as to draw a potential line generally parallel with the peripheral surface W2' and the top surface W3', the positive ion can be caused to collide against the surfaces W27 and W3' from a substantially perpendicular direction thereto and with a large collision energy. As a consequence, the film formed on the surfaces W2' and W3' is thick and has a large adhesive strength.

It should be noted that since the peripheral surface W2' is equal in distance D' to the corresponding cylindrical sleeve 66 over the entire periphery, the thickness of the film formed on this peripheral surface 2' can be equalized in the circumstantial direction.

Formation of the film on the lower end portion of the peripheral surface W2' is as follows. The mounting portion 52 of the first electrode 50 is arranged in a narrower arrangement area defined by the cylindrical auxiliary wall 64. Further, since the peripheral surface of the mounting portion 52 is flush with the peripheral surface W2' of the workpiece W', a similar potential gradient to that of the upper portion can also be obtained at the lower end portion. Moreover, the mounting portion 52 projects upwardly from the auxiliary wall 64, and the potential gradient of the lower portion of the peripheral surface W2' is not affected by the auxiliary wall 64. As a consequence, the film formed on the lower end portion of the peripheral surface W2' can obtain adhesive strength and thickness which are almost no difference from those obtainable at the upper portion.

Also in the device of FIGS. 7 and 8, power can be saved for the same reason as in the first embodiment. In addition, since a film can simultaneously be formed on four workpieces W', productivity is high.

A test for forming a film was carried out by the device of FIGS. 7 and 8. In this test, a high-speed cutting tool having a diameter of 10 mm and a length of 30 mm was used as the workpiece W'. The dimension of the device is as follows. The height of the auxiliary wall 64 was 20 mm, the distance between the auxiliary wall 64 and the mounting portion 52 of the first electrode 50 was 3 mm, and the protrusion of the mounting portion 52 from the upper end edge of the auxiliary wall 64 was 5 mm. The receiving surface 52a of the mounting portion 52 has a circular configuration of a diameter of 10 mm. With the workpiece W' mounted on the first electrode 50, the distance between the peripheral surface W2' of the workpiece W' and its corresponding cylindrical sleeve 66 was 35 mm, and the distance between the top surface W3' of the workpiece W' and the top portion 67a of the cup 67 was also 35 mm.

Other conditions were as follows.

| | |
|---|---|
| Material gas | $CH_4$ + TMS (tetramethylsilane) |
| Gas pressure | 8 Pa |
| Input power | 150 W (13.56 MHz) |
| Gas flow rate | $CH_4$: 5 sccm TMS: 0.7 sccm |
| Film growth time | two hours |

As a result of the above test, the thickness of the amorphous carbonic film formed on the top surface W3' of the workpiece W' was 10 µm and was generally uniform over the entire area of the top surface W3'. The thickness of the film formed on the peripheral surface W2' was 7 µm (±0.5 µm) and the thickness of the film was uniform over the entire area. The peel-off loads to the film on the surfaces W2' and W3' were both 30N.

Next, a comparison test will be described. The device used in the comparison test with the first embodiment was used as it is. The workpiece W' was placed on the first electrode at the center thereof. In this comparison test, the thickness of the film on the top surface W3' of the workpiece W' was 6 µm and was uniform over the entire area. The thickness of the film on the peripheral surface W2' is decreased towards the lower end. The maximum thickness was 5 µm, while the minimum thickness was 1 µm. The peel-off load was 30N on the top surface W3' and about 10N on the peripheral surface W2'.

As apparent from the comparison of the two test results, according to the device of FIGS. 7 and 8, both thickness and adhesive strength of the film were found to be extensively improved.

Also in the above embodiment, the upper surface 52a of the mounting portion 52 may be reduced or slightly increased in diameter than the end face W1' of the workpiece W'. The workpiece may be placed in a horizontal posture.

What is claimed is:

1. A plasma CVD device, comprising:
   a first electrode having a mounting portion for a conductive workpiece;
   a second electrode defining a reaction space, the second electrode having a pair of first opposing walls and a pair of auxiliary walls disposed between the first opposing walls, the auxiliary walls defining an arrangement area for the mounting portion, and wherein the distances between the pair of auxiliary walls and the pair of first opposing walls are equal to each other;
   a vacuum drawing means for evacuating the reaction space;
   a gas supply means for supplying a reaction gas to the reaction space;
   a high-frequency power source connected to the first electrode, the high-frequency power source for supplying a high-frequency power to the reaction space to generate a plasma therein; and
   a bias means for biasing a positive ion of the plasma toward a workpiece mounted on the mounting portion;
   wherein the mounting portion is disposed in the arrangement area in such a manner as to be electrically insulated from the auxiliary walls and to project from distal ends of the auxiliary walls into the reaction space.

2. A plasma CVD device, comprising:
   a first electrode having a mounting portion for a conductive workpiece;
   a second electrode defining a reaction space, the second electrode having a pair of first opposing walls and a pair of auxiliary walls disposed between the first opposing walls, the auxiliary walls defining an arrangement area for the mounting portion, each auxiliary wall being connected to the adjacent first opposing wall by a first connecting wall and wherein the second electrode further includes a second opposing wall facing distal ends of the auxiliary walls and a pair of arcuate second connecting walls connecting the second opposing wall to the first opposing walls;
   a vacuum drawing means for evacuating the reaction space;
   a gas supply means for supplying a reaction gas to the reaction space;
   a high-frequency power source connected to the first electrode, the high-frequency power source for supplying a high-frequency power to the reaction space to generate a plasma therein; and
   a bias means for biasing a positive ion of the plasma toward a workpiece mounted on the mounting portion;
   wherein the mounting portion is disposed in the arrangement area in such a manner as to be electrically insulated from the auxiliary walls and to project from the distal ends of the auxiliary walls into the reaction space.

3. A plasma CVD device, comprising:
   a first electrode having an elongated base and a plurality of mounting portions spaced along the elongated base and wherein a portion of the base between adjacent mounting portions is recessed relative to the mounting portions;
   a second electrode defining a reaction space, the second electrode having a pair of auxiliary walls defining an arrangement area for the first electrode;
   a vacuum drawing means for evacuating the reaction space;
   a gas supply means for supplying a reaction gas to the reaction space;
   a high-frequency power source connected to the first electrode, the high-frequency power source for supplying a high-frequency power to the reaction space to generate a plasma therein;
   a bias means for biasing a positive ion of the plasma toward a workpiece mounted on the mounting portions; and
   the mounting portions being disposed in the arrangement area in such a manner as to be electrically insulated from the auxiliary walls and project from distal ends of the auxiliary walls into the reaction space.

4. A plasma CVD device, comprising:
   a first electrode having a cylindrical mounting portion;
   a second electrode defining a reaction space, the second electrode having a first cylindrical opposing wall and a sleeve-like auxiliary wall concentrically arranged within the first opposing wall, the first opposing wall being connected to the auxiliary wall by a first connecting wall, the auxiliary wall protecting inwardly from the first connecting wall into the reaction space;
   the cylindrical mounting portion of the first electrode being concentrically arranged within the auxiliary wall in such a manner as to be electrically insulated from the auxiliary wall and to project from a distal end of the auxiliary wall into the reaction space;
   a vacuum drawing means for evacuating the reaction space;

a gas supply means for supplying a reaction gas to the reaction space;

a high-frequency power source connected to the first electrode, the high-frequency power source for supplying a high-frequency power to the reaction space to generate a plasma therein; and a bias means for biasing a positive ion of the generated plasma toward a conductive workpiece mounted on the mounting portion.

5. A plasma CVD device according to claim 4, in which said second electrode has a second opposing wall and a second connecting wall for connecting said second opposing wall to said first opposing wall, said second connecting wall being of a semi-spherical shell-like configuration.

6. A plasma CVD device, comprising:

a first electrode having a first base portion and a plurality of mounting portions projecting from the first base portion;

a second electrode having a second base portion with a plurality of insertion holes, a sleeve-like auxiliary wall surrounding each insertion hole, and a plurality of hood portions mounted on the second base portion, the hood portions surrounding the insertion holes and co-acting with the second base portion to define a reaction space, each auxiliary wall having distal ends projecting into the reaction space;

the first base portion being positioned adjacent to the second base portion and the mounting portions being received in the insertion holes and auxiliary walls in such a manner as to project from the distal ends of the auxiliary walls into the reaction space;

a vacuum drawing means for evacuating the reaction space;

a gas supply means for supplying reaction gas to the reaction space;

a high-frequency power source connected to the first electrode, the high-frequency power source for generating a plasma in the reaction space; and a bias means for biasing a positive ion of the generated plasma toward a workpiece on each mounting portion.

* * * * *

UNITED STATES PATENT AND TRADEMARK OFFICE
CERTIFICATE OF CORRECTION

PATENT NO. : 5,861,063
DATED : January 19, 1999
INVENTOR(S) : Kentaro SHOU It is certified that error appears in the above-identified patent and that said Letters Patent is hereby corrected as shown below:

Column 12, claim 4, line 8, "protecting" should be "projecting".

Signed and Sealed this

First Day of June, 1999

Attest:

Q. TODD DICKINSON

*Attesting Officer*  *Acting Commissioner of Patents and Trademarks*